(12) United States Patent
Sobel

(10) Patent No.: US 6,285,719 B1
(45) Date of Patent: Sep. 4, 2001

(54) DIGITAL PHASE SENSITIVE RECTIFICATION OF AC DRIVEN TRANSDUCER SIGNALS

(75) Inventor: Jarl Sobel, Västerås (SE)

(73) Assignee: ABB AB, Vasteras (SE)

( * ) Notice: Subject to any disclaimer, the term of this patent is extended or adjusted under 35 U.S.C. 154(b) by 0 days.

(21) Appl. No.: 09/294,396

(22) Filed: Apr. 20, 1999

(30) Foreign Application Priority Data

Apr. 1, 1999 (SE) .................................................. 9901199

(51) Int. Cl.[7] .................................................. H04L 27/00
(52) U.S. Cl. .......................... 375/259; 375/268; 375/316; 375/320; 329/361; 329/362
(58) Field of Search .................................. 375/268, 316, 375/320, 259; 329/361, 362

(56) References Cited

U.S. PATENT DOCUMENTS

| | | | |
|---|---|---|---|
| 3,793,592 | * 2/1974 | Matonak et al. | 329/346 |
| 3,795,862 | * 3/1974 | Fletcher et al. | 324/118 |
| 4,430,620 | * 2/1984 | Fisher et al. | 329/356 |
| 4,646,004 | * 2/1987 | Brandt et al. | 324/76.53 |
| 4,999,831 | * 3/1991 | Grace | 370/481 |
| 5,036,289 | * 7/1991 | Duran | 327/94 |
| 5,055,843 | * 10/1991 | Ferguson, Jr. et al. | 341/143 |
| 5,477,473 | * 12/1995 | Mandl et al. | 702/189 |
| 5,742,132 | * 4/1998 | Huber et al. | 315/209 R |
| 5,940,447 | * 8/1999 | Connell et al. | 375/316 |

OTHER PUBLICATIONS

The Communications Handbook, Boca Raton, FL, CRC Press, 1997. pp. 3–5. TK5101.C6583 1996.*

* cited by examiner

Primary Examiner—Stephen Chin
Assistant Examiner—Paul N. Rupert
(74) Attorney, Agent, or Firm—Dykema Gossett PLLC

(57) ABSTRACT

A method and a system for phase sensitive rectification of signals from transducers driven by an AC excitation signal will be disclosed. The method and system demand a very moderate calculation capacity, thereby to facilitate the use of low cost microprocessors of ordinary speed. The present method and system utilize a sampling being synchronized with the transducer excitation frequency f. Sampling of the sensor signal is performed by an A/D-converter at a high sampling frequency, nf. The sampled signal then is averaged over half a period of the excitation signal frequency, whereby the starting point of the averaging is decided by the time of commutation. This is equal to filtering the sampled signal by a decimating filter. The rectification may then may be preformed with a number sequence sampled by the optimal sampling frequency 2f (twice the excitation frequency only) instead of the sampling frequency nf used for obtaining high resolution. The output then is further filtered by means of a digital filter acting as an ideal low-pass filter as well as an output filter for achieving a desired output signal level. The signal output will be then be simply made available for further digital processing. However, the output still offers high resolution measurements in spite of only demanding moderate speed microprocessor capacity for the processing.

20 Claims, 3 Drawing Sheets

DIGITAL PHASE SENSITIVE RECTIFICATION OF AC DRIVEN TRANSDUCER SIGNALS

TECHNICAL FIELD

The present invention relates to a method and a system for an improved processing of measuring signals from a sensing transducer, particularly for application to sensing transducers utilizing an excitation AC signal which will be modulated by the sensor.

BACKGROUND

Demodulation of an amplitude-modulated sensor signal from, for instance transducers like a Pressductor© or a LVDT (Linear Variable Differential Transformer), is normally realized using analog techniques and implemented by phase sensitive rectification followed by low-pass filtering. The low-pass filtering is necessary for removing frequency components of higher order (at the excitation frequency and around its overtones) which are introduced by the phase sensitive rectification. In most applications today there is a demand that the signal processing should deliver a digital signal output and be able to communicate with a parent control computer. In many cases the sensor is part of a regulation system.

Such a regulation system is normally accomplished by including a microprocessor in the transducer electronic circuitry. Instead of having the usual analogue demodulation there are many advantages in also introducing digital techniques within this processing stage. The electronic device will for instance contain less components, be more easy to miniaturize and therefore less costly to produce. Besides, the same hardware may be used for several excitation frequencies as the necessary low-pass filtering then is made by means of software control The trivial realization of the analogue solution by means of digital techniques according to the state of the art consists of sampling the transducer signal with a high sampling frequency, rectifying the signal in a phase sensitive way and then achieving low-pass filtering by using a digital filter. Due to the high sampling frequency this method first of all demands a high calculation capacity which must be implemented with a fast digital signal processor (DSP).

A phase sensitive rectification of the periodic quantity to be measured will normally be realized utilizing a phase-locked sampling of the periodic quantity. An example of such a sampling solution is for instance disclosed in U.S. Pat. No. 4,646,004 by the assignee of the present invention.

Another U.S. Pat. No. 5,055,843 discloses a sigma delta modulator with distributed pre-filtering and feedback. An additional filter used allows control of the quantization noise transfer function profile independent of the forward signal transfer function. However, this technical solution involves quite a complicated circuitry for the reduction of the quantization noise and does still not practically solve the technical problems discussed above.

Consequently, there is still a call for simplifying the processing of sensor signals from AC driven transducers to ensure a simple and low cost build-up as well as presenting a reliable operation offering a high measurement resolution. A technique considering an improved method as described below presents a new inventive solution to the problem.

SUMMARY

The present invention relates to an arrangement for a phase sensitive rectification of the sensor signal using a method, which demands a very moderate calculation capacity to thereby facilitate the use of ordinary microprocessors. In addition the method makes it possible to emulate the behavior of older analog signal processing systems, which can therefore be replaced without the need to replace or recalibrate the sensors. The present method and system utilize the fact that the sampling is synchronized to the excitation frequency, f, of the sensor and the phase sensitive rectification is obtained by first sampling the sensor signal at a high sampling frequency, nf. The signal, sampled by means of an A/D-converter controlled by the sampling frequency nf, then is averaged over half a period of the excitation signal frequency, whereby the starting point for the averaging is decided by a synchronizing signal corresponding to the time of commutation. This is equivalent to filtering the sampled signal by a decimating filter with notches at even multiples of the excitation frequency. The rectification may then be performed with a number sequence sampled by the optimal sampling frequency 2·f (twice the excitation frequency) instead of the sampling frequency n·f used for obtaining high resolution. The output then is further filtered by means of a digital filter for achieving a desired output voltage frequency response. The signal output will be easily available for further processing. However, the output still offers high resolution measurements in spite of only demanding moderate speed microprocessor capacity for the further processing, as well as a low resolution A/D-converter.

According to one further embodiment of the method the average of the decimated signal before the phase sensitive rectification is computed by a suitable averaging procedure. This averaging procedure may involve some sort of digital low-pass filtering with a long time constant corresponding to the time constant of changes in an offset voltage. The average is the subtracted from the decimated signal in order to eliminate the influence of a possible offset.

According to still a further embodiment the method uses a digital notch filter applied to the decimated signal after the rectification. Since the ripple due to demodulated DC offsets appears exactly at the excitation frequency, a running average of two values completely eliminates the offset. The method according to the present invention is set forth by the independent claim 1 and the dependent claim 2–10. Further a system according to the present invention is set forth by the independent claim 11 and further embodiments of the system are set forth by the dependent claims 12–20.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
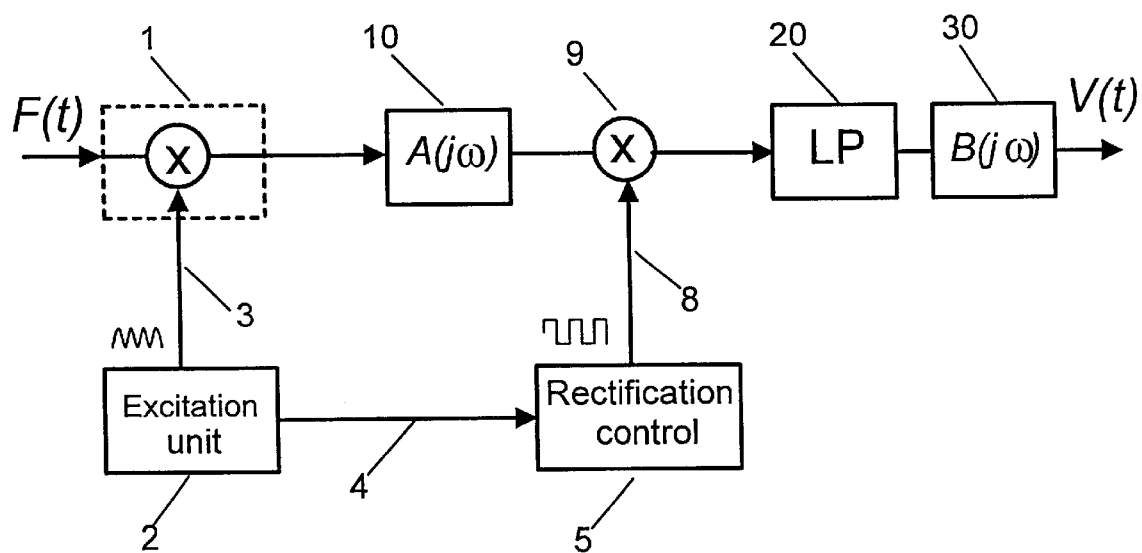
FIG. 1 illustrates a basic embodiment of a signal handling including an analog phase sensitive rectification according to the state of the art for use with a transducer driven by an AC signal.

The advantages of the present invention is best explained in the light of ordinary analog demodulation of amplitude modulated transducer signals, which it emulates. According to the state of the art, this demodulation is accomplished by phase sensitive rectification followed by a low-pass filter, which removes frequency components generated by the nonlinearities in the rectification.

In ordinary (passive) rectification the polarity of the input signal is changed at its zero crossings, i.e. normally two times per period. In the phase sensitive rectification the polarity of the input is changed twice per period according to some externally generated clocking signal. The clocking signal can for example be generated from the zero crossings of the transducer excitation current. Thus, a phase sensitive rectification is equivalent to a multiplication of the sensor signal with a square wave having the same period as the excitation AC signal of the transducer.

It is well known that a square wave of the fundamental angular frequency $\omega_0$ can be expanded into is frequency components according to $$\frac{4}{\pi}\left(\sin(\omega_0 t) + \frac{1}{3}\sin(3\omega_0 t) + \frac{1}{5}\sin(5\omega_0 t) \ldots\right)$$

If a sensor, with an amplitude modulated output signal, measures constant conditions, such a constant force, torque or distance, the output signal exhibits a constant amplitude and phase. The frequency is also constant and equal to the excitation frequency of the transducer.

Using fundamental trigonometric identities such as $$\sin^2(\omega_0 t) = \frac{1}{2}(1 - \cos(2\omega_0 t))$$

and $$\sin(\omega_0 t)\sin(3\omega_0 t) = \frac{1}{2}(\cos(2\omega_0 t) - \cos(4\omega_0 t)),$$

it is found that a sinusoidal sensor signal of constant frequency, constant amplitude, and the same phase as the square wave, is transformed by the phase sensitive rectification into a demodulated DC component having a value of $2/\pi$ times this constant amplitude, and nonlinearly generated overtones with frequencies at even multiples of the excitation frequency.

In order to obtain a high signal-to-noise ratio, the ripple in the output signal due to the nonlinearly generated overtones must be damped out. This is usually accomplished by using a low-pass filter with a cutoff frequency far below the excitation frequency.

The frequency response of the sensor is usually very fast in comparison with the excitation frequency. Thus, the frequency response of the demodulated output signal from the measuring system is determined by the frequency response of the filter used to eliminate the nonlinearly generated overtones.

In every measurement application the output signal of the measuring system should reflect the time dependence of the measured quantity with a minimum of distortion and delay. This is known to require a linear phase of the frequency response and a high cutoff frequency, which is in conflict with the desire for a high signal-to-noise ratio.

To resolve this conflict a notch filter is sometimes used, instead of a low-pass filter. A filter with notches at even multiples of the excitation frequency eliminates the nonlinearly generated overtones, but can be made to exhibit a fast frequency response and linear phase for lower frequencies. Such an analog notch filter requires a lot of components, which in addition have to be individually trimmed in order to accurately yield notches at the correct frequencies. This makes the use of analog notch filters very costly.

On the other hand digital filters have properties, which are uniquely determined by their mathematical algorithm. It is well known that a filter which involves the computation of a running average of m values, sampled with a period Ts, has notches at frequencies given by $$f_n = \frac{n}{mT_s},$$

where n is an integer number, n=1, 2, . . .

If the sampling frequency $$f_s \equiv \frac{1}{T_s},$$

and the number m are selected such that the excitation frequency $f_0$ satisfies $$f_0 = \frac{1}{2mT_s}$$

then a simple running average of m values will yield notches at exactly the required frequencies. Furthermore, such a filter has the shortest possible impulse response (only one half period). This filter, which in the terminology of digital signal processing is classified as a symmetric FIR-filter, is known to exhibit a linear phase dependence.

The formula above can easily be interpreted. It means that the signal should be sampled an even number of times (2m) each period, and that the filtering consists of computing for instance a running average of a number of samples corresponding to a half period.

It is also well known that an amplitude modulated output signal cannot be used to represent a measurement signal with a frequency higher than the excitation frequency. It is therefore assumed that the frequency content of the measurement signal above the excitation frequency is negligible.

Such a signal can be represented in sampled form without the loss of information if the sampling frequency is twice that of the excitation frequency, according to what is referred to as the Nyquist criterion. Consequently, one sample per half period of the amplitude modulated output signal of the transducer is all that is needed.

The digital notch filter mentioned above can therefore be combined with a decimation of the sampling rate by a factor m without loss of information. This is highly advantageous in digital systems. All that is required is a non-overlapping summation of the samples corresponding to each half period.

Finally, it is recognized that if the starting point of summation is selected as the first sample following the zero crossing of the square wave implied by the phase sensitive rectification, the order of rectification and summation can be reversed. This is an important difference with respect to current analog systems. Thus, the phase sensitive rectification can be performed at the decimated sampling rate, and simply consists of changing the sign of every second value. It can be shown that this procedure emulates an analog phase sensitive rectification where the polarity reversal occurs exactly in the middle between the last and first samples of two adjacent half periods.

A complication, which has to be taken into account in every practical implementation of this system, is that the digital values sampled from the output signal will invariably contain a DC offset. This may be due to offset voltages in the analog signal conditioning circuitry, or simply due to the fact that the signal is sampled using an A/D-converter with unipolar input.

If a DC signal is rectified in a phase sensitive way, this results in nonlinearly generated overtones at odd multiples of the excitation frequency. If analog phase sensitive rectification is used this ripple is usually eliminated from the demodulated output by an even lower cutoff frequency of the low-pass filter or by an additional notch at the excitation frequency, if notch filtering is used.

In the digital system, the ripple due to DC offset can easily be eliminated in two ways. It must be recognized that the offset affects every sample by the same amount. Therefore we may just as well operate on the decimated signal, i.e., after the summing over half periods. The first way consists of high-pass filtering the summed half periods before rectification, the second way involves notch filtering of the rectified signal.

FIG. 1 illustrates basic functioning blocks of a dedicated electronic circuitry for an analog phase sensitive rectification of transducer signals when utilizing a transducer 1 driven by an AC current excitation signal according to the state of the art. Such a transducer, for instance a Pressductor©, is used for converting a time dependent force F(t) into a time dependent voltage V(t) for instance to be used in a control system. The transducer works as a non-linear transformer with a force dependent coupling factor. A magnetic field in the transducer is generated by a time varying current provided by the excitation unit 2. The output voltage from the transducer is proportional to the time derivative of the magnetic flux in a secondary winding. The amplitude of this secondary flux is proportional to the force to be measured. Thus the transducer performs a multiplication of the force with the excitation current, in addition to a phase shift and nonlinear effects.

The demodulation of the amplitude modulated transducer output is performed by the signal processing circuitry. The transducer output is filtered by an input filter 10 having a transfer function $A(j\omega)$, and is then demodulated by a phase sensitive rectification. The phase sensitive rectification in a detector 9 can be seen as a multiplication of the transducer output with a square wave, having a well determined phase relationship relative to the excitation.

This square wave is derived by a rectification control unit 5 from a signal indicated by the reference 4 having the same frequency as the actual excitation current supplied by the excitation unit 2 and indicated by the reference 3. Generally this current signal 4 is delayed and filtered and the zero crossings of the filtered current signal are then detected by a comparator to form the square wave signal indicated by reference 8.

Low frequency components of the rectified output voltage corresponds to the low frequency components of the force acting on the transducer 1. In addition to performing the necessary demodulation, the rectification produces a ripple with a fundamental frequency equal to twice the excitation 20 frequency. The signal is therefore low-pass filtered by a filter 20 to remove this high frequency ripple from the output voltage. The output filter is modeled as an ideal low-pass filter which removes all frequency components higher than the excitation frequency, $\omega_0$, followed by an output filter 30 having a transfer function $B(j\omega)$, which yields the characteristic frequency dependence of the output signal.

Figure 2:
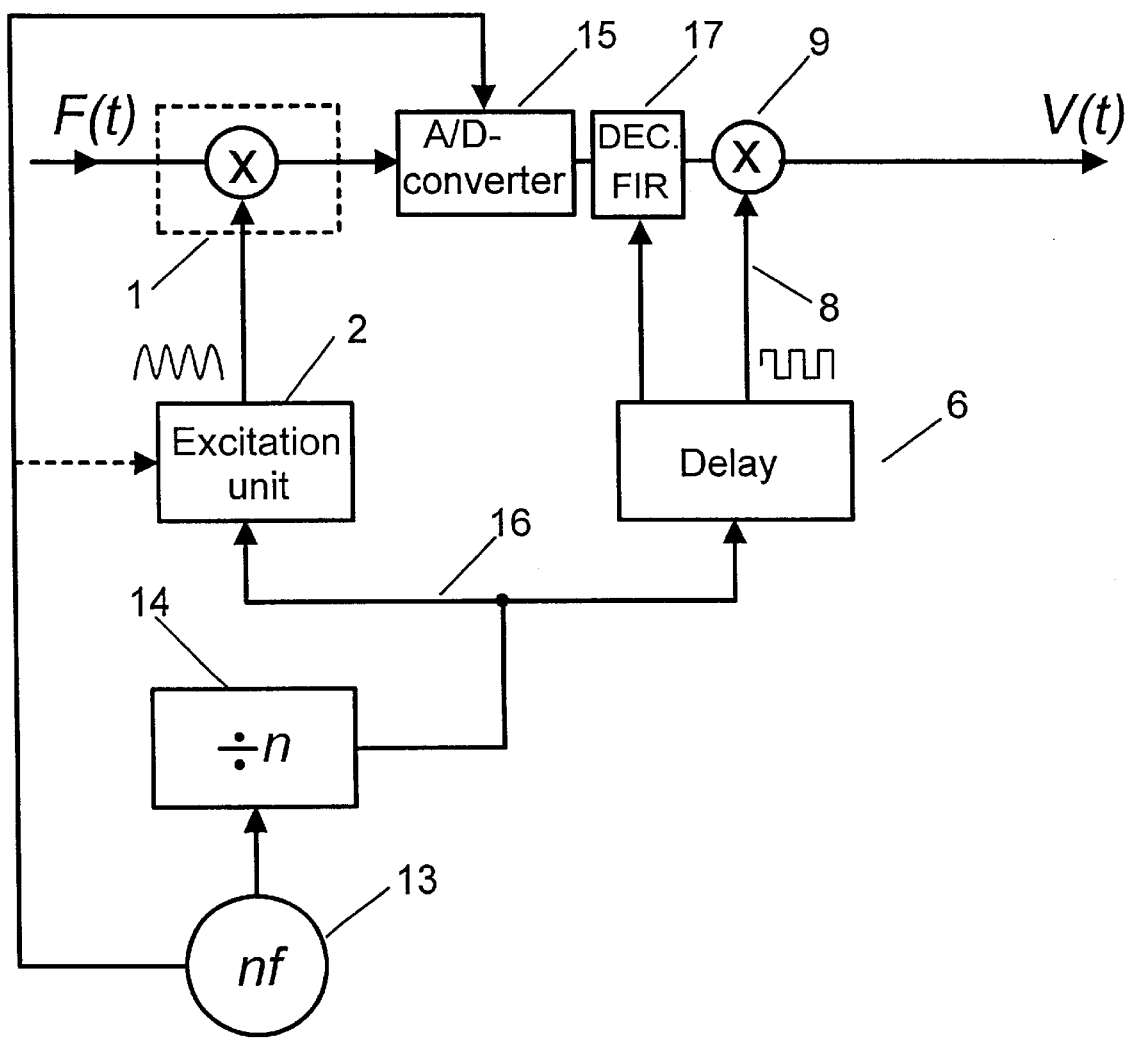
FIG. 2 illustrates an embodiment of an improved signal handling system for a transducer driven by an AC signal in accordance with the present inventive method.

The present invention presents an entirely digital solution emulating the ideal performance of the general circuitry according to FIG. 1. FIG. 2 presents a basic block diagram illustrating such a digital signal processing system. The phase sensitive rectification is performed digitally on sampled values of the transducer signal. Digital output values are here obtained directly. If still an analog output signal is desired, it can be obtained by means of a D/A-converter.

According to FIG. 2 the transducer output signal is sampled by an A/D-converter 15 being controlled by a clock generator 13 producing a clock signal at a frequency nf. After the A/D-converter is positioned a decimating FIR filter 17, which is synchronized via the unit 6. The clock generator 13 also, via a divider circuitry 14, delivers a synchronization signal at frequency f indicated by reference number 16. The synchronization signal 16 controls the excitation unit 2, which then will deliver an excitation current to the transducer of frequency f The excitation unit 2 can also be controlled directly by the clock generator. The phase sensitive rectification is achieved by simply summing values over half a period and then changing the sign of every second sum. This procedure will then yield an output frequency equal to 2f. It also eliminates the need for a low-pass filter following the rectifier, performs a necessary decimation of the data rate, and reduces the computational effort by several orders of magnitude.

The digital phase sensitive rectification increases the resolution and accuracy of the digitized transducer signal, since the resulting value for one half period is the sum of several A/D-converted samples. This is to be compared with a single A/D conversion of a rectified and low-pass filtered analog signal according to previous systems.

Furthermore, due to the synchronization arrangement the rectification has a fixed phase relationship with respect to the control value of the excitation current. The phase of the signal 8 for the phase sensitive rectification is then determined by a fixed delay 6 with respect to the common synchronization signal 16. This eliminates circuitry for phase lag and zero crossing detection of the excitation current, used for obtaining the rectifier control voltage necessary in an analog rectifier. It thus also eliminates low frequency variations of the output voltage due to noise in the rectifier control circuitry.

An additional delay in the system comes from the A/D-converter and is among other things due to a digital filtering performed in the A/D-converter and involves for instance in an illustrative embodiment a suitable marketed 20 bit A/D-converter. Such a suitable A/D-converter uses delta-sigma modulation and may in a typical case present a delay equal to 32 samples, which is not negligible if the excitation frequency is high and may then correspond to a whole period of the excitation frequency. However this will then be compensated by the delay 6.

The minimum step response obtained using digital rectification is very short. In principle it is only needed to compute the values for one half period to obtain a new value, although in most cases a running average of the last two half periods may be used as the fastest output rate. This eliminates offset errors and further increases resolution and suppresses noise. The fastest output rate of the transducer signal processing according an embodiment according to FIG. 2 is thus equal to two times the excitation frequency, i.e. 2f. The cutoff frequency will be equal to half of the excitation frequency, i.e. f/2.

As a system using the present method makes it possible to emulate the behavior of older analog signal processing systems, those can therefore be replaced without the need to replace or recalibrate the sensors.

Since transducers like a Pressductor© or a LVDT are nonlinear devices, it is necessary to emulate how the different overtones of the filtered transducer signal are combined in the rectifier and contributing to the result. An additional complication arises if amplitude and phase of the overtones in the transducer signal are changed by a linear input filter prior to the phase sensitive rectification. An example of such filtering sometimes have to be introduced in mains-operated 50 or 60 Hz system to obtain compensation for variations in the sensitivity of the transducer with the frequency of the mains. In other systems input filtering is introduced simply to improve noise immunity.

A straightforward way to emulate an analog input filter is to implement it as a digital filter in the digital signal processing. However instead of filtering the transducer signal with the input filter 10 (FIG. 1) with a transfer function $A(j\omega)$, the complex conjugate $A^*(j\omega)$ of the filter transfer function can be applied to the square wave signal 8. This is easily achieved when relying on digitally implemented filtering. The use of the complex conjugate reflects the fact that if the phase of the transducer signal is retarded by the filter, the equivalent filtering of the square wave must advance the phase in order to yield the same result.

The values of the filtered square wave for one half period are calculated in advance, once and for all, and stored in the system. To perform the digital phase sensitive rectification, samples from each half period of the unfiltered transducer signal are now multiplied by the values of such a stored vector and subsequently summed.

Figure 3:
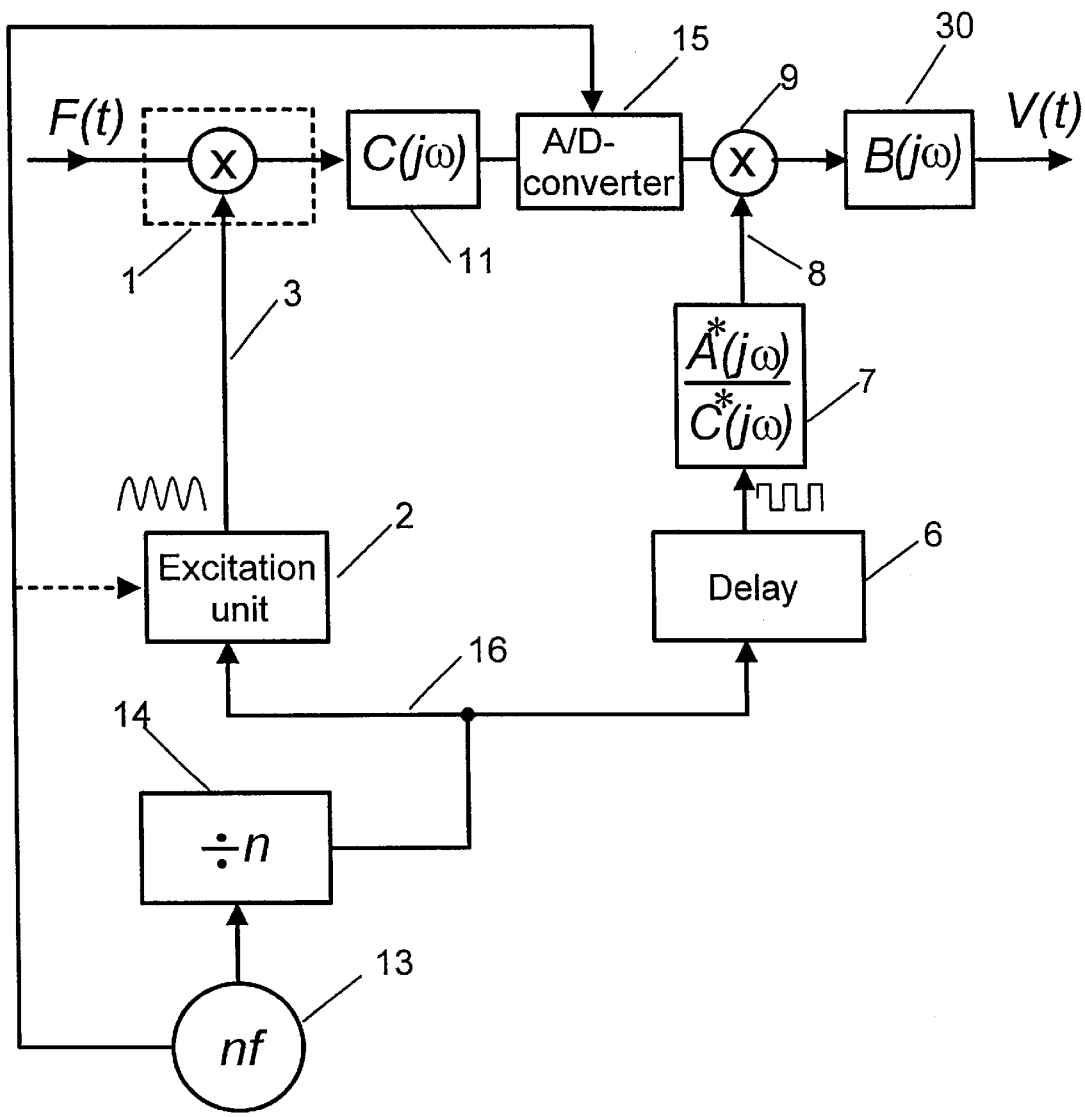
FIG. 3 illustrates the principle of a further embodiment of a system in accordance with the present invention and specifically designed to emulate the analog system according to FIG. 1.

FIG. 3 illustrates the principle of a further embodiment of the present transducer signal demodulator. In this actual design the A/D-converter is preceded by a filter 11 having a transfer function $C(j\omega)$ to suppress noise and interference and to provide anti-aliasing. In order to compensate for the effect of this filter, the square wave is additionally digitally filtered by the divided complex conjugates of the transfer functions $A(j\omega)$ and $C(j\omega)$, respectively, as indicated by the filter block 7 in FIG. 3.

This comprises the further step of, instead of summing filtered samples taken from the transducer signal during half a period, multiplying unfiltered samples by a weighting function having a form being determined by the input filters to be emulated. This weighting function will be determined by solving an associated differential equation, the form of which and its border conditions being determined by the filter coefficients of the corresponding filters.

The general case with a weighting function can be used for other purposes than to emulate the effect on an input filter in an analog signal processing system. For example, the weighting function may be selected having the shape of a sine wave with the same period as the excitation signal, in order to improve the noise immunity of the demodulated signal.

Suppose that the transducer output signal f(t) with Fourier spectrum of $F(j\omega)$ is filtered by an input filter having the transfer function $A(j\omega)$. An ordinary phase sensitive rectification can be described in that the filtered signal $f_A(t)$ is multiplied by a square wave q(t), with corresponding spectrum $Q(j\omega)$, such that the signal out from the phase sensitive rectifier is equal to $$u(t)=q(t)f_A(t).$$

This output signal is then low-pass filtered such that the DC component containing the force signal is derived. In accordance to Fourier analysis a multiplication in a time domain corresponds to a convolution in the frequency domain. The Fourier transform of the previous expression then becomes:

$$U(j\omega) = \frac{1}{2\pi}\int_{-\infty}^{\infty} Q(j(\omega-\omega_1))A(j\omega_1)F(j\omega_1)d\omega_1$$

As $A^*(-j\omega)=A(j\omega)$, then for $\omega=0$ the value of this expression becomes equal to the value for $\omega=0$ of the expression $$V(j\omega) = \frac{1}{2\pi}\int_{-\infty}^{\infty} Q(j(\omega-\omega_1))A^*(j(\omega-\omega_1))F(\varphi\omega_1)d\omega_1$$

In the time domain this implies that it is possible to form $$\upsilon(t)=\theta(t)F(t).$$

$\theta(t)$ is referred to as being the filtered square wave and will be defined by its Fourier transform $$\Theta(j\omega)=Q(j\omega)A^*(j\omega).$$

The DC component of $\upsilon(t)$ is exactly the same as for u(t) as $V(0)=U(0)$. Furthermore it is very simple to digitally implement $\upsilon(t)$, as it only implies a multiplication of the transducer signal f(t) by a known weighting function.

According to a further embodiment of the present method, in order to obtain the fastest possible response, the average of the decimated signal before the phase sensitive rectification (i.e. the offset) is computed by a suitable averaging procedure. This averaging procedure involves some kind of digital low-pass filtering with a very long time constant corresponding to the time constant of the changes in the offset. Examples of such filters, which are easily implemented and require very little system resources, are known to anyone skilled in the art. The processing includes a simple running average over many half periods, or exponential averaging (single pole IIR-filter). The average thus computed is then subtracted from each value before the result is passed on to the phase sensitive rectification. This eliminates the ripple without affecting the impulse response of the electronics. It should be noted that this procedure is only possible when the order of filtering and phase sensitive rectification is reversed with respect to analog phase sensitive rectification as discussed above.

An alternative development of the present method involves the use of a digital notch filter applied to the decimated signal after the rectification. The construction of this type of digital filters is also well known to anyone skilled in the art. Since the ripple due to DC offset appears exactly at the excitation frequency, a running average of two consecutive values completely eliminates this offset. The present method can combined with other digital filtering of the output signal and is especially suitable in applications where a high signal to noise ratio is more important than a fast frequency response.

A further advantage of the present disclosed design for an entirely digital signal processing of an amplitude modulated transducer signal for further processing is that the entire digitally operating device will be suitable for simple build-up into a single circuitry.

It will be understood a person skilled in the art that various modifications and changes may be made to the present invention without departure from the scope thereof, which is defined by the appended claims.

What is claimed is:

1. A method for processing signals from a transducer driven by an alternating current (AC) excitation signal, which transducer as output produces an amplitude-modulated signal containing the quantity to be measured, comprising the steps of:

generating a first clocking signal of frequency n f for the sampling of the transducer signal and synchronized with said excitation signal, n being an even integer greater than or equal to 4, generating a second clocking signal of frequency f synchronized with said excitation signal, sampling the transducer output signal at a frequency n f controlled by said first clocking signal, producing half period averages by means of computing a weighted average of n/2 samples of the transducer AC output signal, the starting point of said averaging being in synchronism with said second clocking signal, thereby obtaining a reduction of measurement values corresponding to an optimal sampling at 2f, in a phase sensitive way rectifying and demodulating the sampled transducer signal by alternately changing the sign of said half period averages according to the logical value of said second clocking signal.

2. The method according to claim 1, comprising the step of giving all samples in said half period averages an equal weight, thereby minimizing the computational effort involved in the signal processing.

3. The method according to claim 1, comprising the further step of performing the sampling of the transducer signal by means of an A/D-converter.

4. The method according to claim 1, comprising the step of introducing a time delay to said second clocking signal of frequency f for compensating phase shifts in the signals processed.

5. The method according to claim 1, comprising the additional steps of generating said excitation AC signal and said second clocking signal by dividing said first clocking signal by a factor n and subsequently generating said excitation AC waveform by means of a D/A-converter.

6. The method according to claim 3, in order to emulate the behavior of an analog processing unit having an input filter to be emulated and with a transfer function $A(j\omega)$, in a digital signal processing system having an actual input filter with a transfer function $C(j\omega)$, comprising a step of producing said half period averages using a weighting function resulting from a mathematical filtering of a square wave with a complex conjugate quotient $A^*(j\omega)/C^*(j\omega)$ between the transfer functions of said input filter to be emulated and said actual input filter, said square wave having the same frequency as said second clocking signal.

7. The method according to claim 3, comprising the step of producing said half period averages by using a weighting function having the shape of a sine wave with the same frequency as said second clocking signal.

8. The method according to claim 3, comprising the additional step of performing a digital high-pass filtering before the rectification, over many half period averages, said digital high-pass filtering having a very long time constant compared with the period of the excitation signal, thereby completely eliminating ripple in the rectified output due to a DC offset in said half period averages.

9. The method according to claim 3, comprising the additional step of performing a digital notch filtering following the rectification of the half period averages, said digital notch filtering presenting notches at frequencies corresponding to odd multiples of the excitation frequency.

10. The method according to claim 9, comprising the step of performing said digital notch filtering by computing a running average of two consecutive values.

11. A system for processing signals from a transducer driven by an alternating current (AC) excitation signal, which device produces an amplitude-modulated signal output, the system further comprising:

a generator generating an excitation signal of frequency f for the AC excitation of the transducer, a clock generator generating a first clocking signal of frequency n·f for the sampling of the transducer signal and synchronized with said excitation signal, a frequency dividing means generating a second clocking signal of frequency f from the first clocking signal, a sampling means sampling the transducer output signal at a frequency n·f controlled by said first clocking signal, n being an even integer greater than or equal to 4, an averaging means producing half period averages by means of computing a weighted average of n/2 samples of the transducer AC output signal, the starting point of said averaging being in synchronism with said second clocking signal, thereby obtaining a reduction of measurement values corresponding to an optimal sampling at 2f, but still with better resolution resulting from the sampling at the frequency n·f, a rectifying means for in a phase sensitive way rectifying and demodulating the sampled transducer signal by altering changing sign of said half period averages according to a logical value of said second clocking signal.

12. The system according to claim 11, wherein all samples in said half period averages have equal weight, thereby minimizing the computational effort involved in the signal processing.

13. The system according to claim 11, wherein the sampling of the transducer signal is performed by means of an A/D-converter controlled by said first clocking signal of frequency n·f.

14. The system according to claim 11, wherein a time delay is introduced to said second clocking signal of frequency f for compensating phase shifts in the signals processed.

15. The system according to claim 11, wherein said excitation AC signal and said second clocking signal are generated by dividing said first clocking signal by a factor n and subsequently generating said excitation AC waveform by means of a D/A-converter.

16. The system according to claim 13, in order to emulate the behavior of an analog processing unit having an input filter to be emulated and with a transfer function $A(j\omega)$, wherein a digital signal processing system having an actual input filter with a transfer function $C(j\omega)$ is introduced and said half period averages are produced by using a weighting function resulting from the mathematical filtering of a square wave with a complex conjugate quotient $A^*(J\omega)/C^*(j\omega)$ between the transfer functions of said input filter to be emulated and said actual input filter, said square wave having the same frequency as the second clocking signal.

17. The system according to claim 13, wherein said half period averages are produced by using a weighting function having the shape of a sine wave with the same frequency as said second clocking signal.

18. The system according to claim 13, wherein a digital high-pass filtering is performed before the rectification, over many half period averages, said digital high-pass filtering having a very long time constant compared with the period of the excitation signal, thereby completely eliminating ripple in the rectified output due to a DC offset in said half period averages.

19. The system according to claim 13, wherein a digital notch filter is performed following the rectification of the half period averages, said digital notch filter having notches at frequencies corresponding to odd multiples of the excitation frequency.

20. The system according to claim 19, wherein said digital notch filtering is performed by computing a running average of two consecutive values.

* * * * *